(12) United States Patent
Kobayashi et al.

(10) Patent No.: US 10,498,979 B2
(45) Date of Patent: Dec. 3, 2019

(54) IMAGE PICKUP APPARATUS, METHOD FOR CONTROLLING IMAGE PICKUP APPARATUS, AND IMAGE PICKUP SYSTEM

(71) Applicant: CANON KABUSHIKI KAISHA, Tokyo (JP)

(72) Inventors: Masahiro Kobayashi, Tokyo (JP); Yusuke Onuki, Fujisawa (JP); Yasushi Matsuno, Fujisawa (JP); Kazunari Kawabata, Mitaka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 23 days.

(21) Appl. No.: 15/584,718

(22) Filed: May 2, 2017

(65) Prior Publication Data
US 2017/0359538 A1 Dec. 14, 2017

(30) Foreign Application Priority Data
Jun. 10, 2016 (JP) .................. 2016-116352

(51) Int. Cl.
*H04N 5/355* (2011.01)
*H04N 5/353* (2011.01)
(Continued)

(52) U.S. Cl.
CPC ....... *H04N 5/35545* (2013.01); *H01L 27/148* (2013.01); *H04N 5/335* (2013.01);
(Continued)

(58) Field of Classification Search
CPC .......... H04N 5/35545; H04N 5/37452; H04N 5/378; H04N 5/3745; H04N 5/335; H04N 5/341; H04N 5/353; H01L 27/148
(Continued)

(56) References Cited

U.S. PATENT DOCUMENTS 6,078,037 A * 6/2000 Booth, Jr. ......... H01L 27/14609
250/208.1
7,271,835 B2 9/2007 Iizuka et al. .................. 348/314
(Continued)

FOREIGN PATENT DOCUMENTS

| JP | 2004-111590 | 4/2004 |
|----|-------------|--------|
| JP | 2015-177349 | 10/2015 |
| WO | 2011/096340 | 8/2011 |

OTHER PUBLICATIONS

U.S. Appl. No. 15/467,919, filed Mar. 23, 2017.
(Continued)

*Primary Examiner* — Albert H Cutler
(74) *Attorney, Agent, or Firm* — Venable LLP

(57) ABSTRACT

An image pickup apparatus according to the present invention includes a plurality of pixels arranged in rows and columns, and each of the pixels includes a photoelectric conversion unit that accumulates signal charge generated by photoelectric conversion of irradiated light, a first holding unit and a second holding unit that hold the signal charge transferred from the photoelectric conversion unit, and an output unit that outputs, to a column signal line, a signal based on an amount of the signal charge held by the first holding unit or the second holding unit. The first holding unit and the second holding unit alternately hold the signal charge generated in the photoelectric conversion unit for each frame period, and in a period in which the signal charge is not transferred from the photoelectric conversion unit, the first holding unit and the second holding unit output the signal charge to the output unit.

14 Claims, 10 Drawing Sheets

(51) Int. Cl.
*H04N 5/3745* (2011.01)
*H01L 27/148* (2006.01)
*H04N 5/378* (2011.01)
*H04N 5/341* (2011.01)
*H04N 5/335* (2011.01)

(52) U.S. Cl.
CPC ............ *H04N 5/341* (2013.01); *H04N 5/353* (2013.01); *H04N 5/378* (2013.01); *H04N 5/3745* (2013.01); *H04N 5/37452* (2013.01)

(58) Field of Classification Search
USPC ....................................................... 348/308
See application file for complete search history.

(56) References Cited

U.S. PATENT DOCUMENTS

| | | | |
|---|---|---|---|
| 7,462,810 B2 | 12/2008 | Kobayashi et al. | 250/208.1 |
| 7,928,477 B2 | 4/2011 | Kobayashi et al. | 257/225 |
| 7,935,995 B2 | 5/2011 | Watanabe et al. | 257/292 |
| 8,045,034 B2 | 10/2011 | Shibata et al. | 348/308 |
| 8,063,351 B2 | 11/2011 | Kobayashi et al. | 250/208.1 |
| 8,115,848 B2 | 2/2012 | Onuki et al. | 348/308 |
| 8,174,604 B2 | 5/2012 | Shibata et al. | 348/308 |
| 8,222,682 B2 | 7/2012 | Watanabe et al. | 257/292 |
| 8,259,206 B1 | 9/2012 | Shibata et al. | 348/308 |
| 8,289,432 B2 | 10/2012 | Shibata et al. | 348/308 |
| 8,357,956 B2 | 1/2013 | Kobayashi et al. | 257/225 |
| 8,427,564 B2 | 4/2013 | Yamashita et al. | 348/294 |
| 8,456,559 B2 | 6/2013 | Yamashita et al. | 348/308 |
| 8,552,353 B2 | 10/2013 | Kobayashi et al. | 250/208.1 |
| 8,599,294 B2 * | 12/2013 | Sa | H01L 27/14609 348/294 |
| 8,723,232 B2 | 5/2014 | Kobayashi et al. | 257/225 |
| 8,736,734 B2 | 5/2014 | Onuki et al. | 348/308 |
| 8,786,745 B2 | 7/2014 | Kawahito et al. | 348/296 |
| 8,884,391 B2 | 11/2014 | Fudaba et al. | 257/432 |
| 9,006,635 B2 * | 4/2015 | Kurokawa | H01L 27/144 250/208.1 |
| 9,019,141 B2 | 4/2015 | Hashimoto et al. | 341/168 |
| 9,049,389 B2 | 6/2015 | Hashimoto et al. | H04N 5/353 |
| 9,147,708 B2 | 9/2015 | Okita et al. | H01L 27/1461 |
| 9,153,610 B2 | 10/2015 | Kobayashi et al. | H04N 5/378 |
| 9,159,750 B2 | 10/2015 | Ikeda et al. | H03M 1/186 |
| 9,247,161 B2 | 1/2016 | Hashimoto et al. | H04N 5/374 |
| 9,276,027 B2 | 3/2016 | Okita et al. | H01L 27/14812 |
| 9,300,889 B2 | 3/2016 | Hashimoto et al. | H04N 5/357 |
| 9,344,653 B2 | 5/2016 | Shimotsusa et al. | H01L 27/14623 |
| 9,419,038 B2 | 8/2016 | Kobayashi et al. | H01L 27/14612 |
| 9,445,026 B2 | 9/2016 | Kobayashi et al. | H01L 27/14636 |
| 9,485,445 B2 | 11/2016 | Hashimoto et al. | H04N 5/374 |
| 9,538,112 B2 | 1/2017 | Wada et al. | H04N 5/378 |
| 9,548,328 B2 | 1/2017 | Hasegawa et al. | H01L 27/1464 |
| 9,560,285 B2 | 1/2017 | Ichikawa et al. | H04N 5/2353 |
| 9,602,752 B2 | 3/2017 | Kobayashi et al. | H01L 27/14603 |
| 9,615,044 B2 | 4/2017 | Hashimoto et al. | H04N 5/374 |
| 2005/0157194 A1 * | 7/2005 | Altice, Jr. | H04N 5/35581 348/308 |
| 2008/0018763 A1 * | 1/2008 | Sato | H04N 5/335 348/308 |
| 2008/0231737 A1 * | 9/2008 | Weale | H04N 5/335 348/308 |
| 2011/0090385 A1 * | 4/2011 | Aoyama | H01L 27/14603 348/308 |
| 2012/0033118 A1 * | 2/2012 | Lee | H01L 27/14609 348/296 |
| 2013/0206965 A1 | 8/2013 | Yamashita et al. | 250/208.1 |
| 2014/0061436 A1 | 3/2014 | Kobayashi | 250/208.1 |
| 2014/0375979 A1 * | 12/2014 | Oh | H04N 3/155 356/5.01 |
| 2015/0144790 A1 * | 5/2015 | Velichko | H01L 27/14875 250/338.4 |
| 2015/0264283 A1 | 9/2015 | Kobayashi et al. | H01L 27/1463 |
| 2015/0281614 A1 | 10/2015 | Yoshida et al. | H04N 5/3745 |
| 2015/0281616 A1 | 10/2015 | Muto et al. | H04N 5/3575 |
| 2016/0071896 A1 | 3/2016 | Kawabata et al. | H01L 27/14621 |
| 2016/0071902 A1 | 3/2016 | Okita et al. | H01L 27/14625 |
| 2016/0182847 A1 * | 6/2016 | Wan | H04N 5/3765 348/302 |
| 2016/0227139 A1 | 8/2016 | Shimotsusa et al. | H01L 27/14627 |
| 2016/0322406 A1 | 11/2016 | Kobayashi et al. | H01L 27/14612 |
| 2016/0334550 A1 | 11/2016 | Kawabata | G02B 3/0056 |
| 2016/0334621 A1 | 11/2016 | Kawabata et al. | H01L 27/14627 |
| 2016/0360126 A1 | 12/2016 | Soda et al. | H01L 27/14641 |
| 2016/0366350 A1 * | 12/2016 | Roffet | H04N 5/3597 |
| 2017/0077164 A1 | 3/2017 | Kawabata | H01L 27/14645 |
| 2017/0078557 A1 | 3/2017 | Kawabata et al. | H04N 5/37457 |
| 2017/0078594 A1 | 3/2017 | Kawabata et al. | H04N 5/2353 |
| 2017/0078604 A1 | 3/2017 | Kobayashi et al. | H04N 5/3575 |
| 2017/0118428 A1 | 4/2017 | Muto et al. | H04N 5/3658 |
| 2017/0142363 A1 | 5/2017 | Hashimoto et al. | H04N 5/378 |

OTHER PUBLICATIONS

U.S. Appl. No. 15/631,391, filed Jun. 23, 2017.
U.S. Appl. No. 15/594,259, filed May 12, 2017.
U.S. Appl. No. 15/601,620, filed May 22, 2017.

* cited by examiner

IMAGE PICKUP APPARATUS, METHOD FOR CONTROLLING IMAGE PICKUP APPARATUS, AND IMAGE PICKUP SYSTEM

BACKGROUND OF THE INVENTION

Field of the Invention

The present invention relates to an image pickup apparatus including a holding unit for holding signal charge generated in a photoelectric conversion unit of a pixel, a method for controlling an image pickup apparatus, and an image pickup system.

Description of the Related Art

For recent CMOS image sensors, a so-called global electronic shutter with which accumulation periods (exposure periods) of signal charge coincide with one another among a plurality of pixels has been proposed. For example, image pickup apparatuses described in Japanese Patent Application Laid-Open Nos. 2004-111590 and 2015-177349 avoid distortion in an image of a quickly moving object by using a global electronic shutter.

In the image pickup apparatus described in Japanese Patent Application Laid-Open No. 2004-111590, signal charge corresponding to one frame and generated by photoelectric conversion is transferred from photoelectric conversion units to holding units at the same time in a plurality of pixels. With this configuration, accumulation periods of signal charge coincide with one another among a plurality of pixels, and thus, a global electronic shutter can be achieved. In Japanese Patent Application Laid-Open No. 2004-111590, however, signal charge corresponding to one frame and generated by photoelectric conversion is first accumulated in a photoelectric conversion unit. Thus, the photoelectric conversion unit needs to have a large storage capacity (quantity of saturated charge). When the storage capacity of the photoelectric conversion unit is increased, the area of the photoelectric conversion unit increases, and a pixel size increases accordingly.

In view of the foregoing problem, in the image pickup apparatus described in Japanese Patent Application Laid-Open No. 2015-177349, while signal charge generated by photoelectric conversion is accumulated in a photoelectric conversion unit, signal charge corresponding to one frame is divided into parts to be sequentially transferred from the photoelectric conversion unit to the holding unit. This eliminates the necessity for accumulating signal charge corresponding to one frame in the photoelectric conversion unit, and thus, the storage capacity of the photoelectric conversion unit can be reduced.

Even in the image pickup apparatus described in Japanese Patent Application Laid-Open No. 2015-177349, however, while a pixel signal based on signal charge held by the holding unit is being read out, signal charge newly generated in the photoelectric conversion unit cannot be transferred to the holding unit. In particular, since accumulation periods need to coincide with one another among a plurality of pixels in a global electronic shutter operation, while a signal is being read out from the holding unit in at least one of the pixels, accumulation periods cannot start and signal charge cannot be transferred to the holding units in the other pixels.

Consequently, if the readout speed is not high, the accumulation period of signal charge is short so that problems such as degradation of image quality due to a loss of video information based on signal charge or a phenomenon such as jerkiness arise. Although signal charge generated in the readout period can be accumulated in the photoelectric conversion unit, this accumulation requires an increased storage capacity of the photoelectric conversion unit, and thus, a pixel size also increases.

SUMMARY OF THE INVENTION

An image pickup apparatus according to the present invention includes a plurality of pixels arranged in rows and columns, and each of the plurality of pixels includes a photoelectric conversion unit that accumulates signal charge generated by photoelectric conversion of irradiated light, a first holding unit and a second holding unit that hold the signal charge transferred from the photoelectric conversion unit, and an output unit that outputs, to a column signal line, a signal based on an amount of the signal charge held by the first holding unit or the second holding unit, wherein the first holding unit and the second holding unit alternately hold the signal charge generated in the photoelectric conversion unit for each frame period, and in a period in which the signal charge is not transferred from the photoelectric conversion unit, the first holding unit and the second holding unit output the signal charge to the output unit.

A method for controlling an image pickup apparatus according to the present invention is a method for controlling an image pickup apparatus including a plurality of pixels arranged in rows and columns, and each of the plurality of pixels includes a photoelectric conversion unit that accumulates signal charge generated by photoelectric conversion of irradiated light, a first holding unit and a second holding unit that hold the signal charge transferred from the photoelectric conversion unit, and an output unit that outputs, to a column signal line, a signal based on an amount of the signal charge held by the first holding unit or the second holding unit. The method includes the steps of: alternately holding, in the first holding unit and the second holding unit, the signal charge generated in the photoelectric conversion unit for each frame period; and outputting the signal charge to the output unit from the first holding unit or the second holding unit in a period in which the signal charge is not transferred from the photoelectric conversion unit.

Further features of the present invention will become apparent from the following description of exemplary embodiments with reference to the attached drawings.

DESCRIPTION OF THE EMBODIMENTS

As described above, especially an image pickup apparatus for performing a global electronic shutter operation needs to accept one of an increase in pixel size by increasing a storage capacity of a photoelectric conversion unit or degradation of image quality of a video image by shortening an accumulation period of the photoelectric conversion unit. In a current situation of an image pickup apparatuses requiring a larger number of pixels, however, an increase in pixel size is not acceptable. On the other hand, a shorter accumulation period of the photoelectric conversion unit causes not only degradation of image quality but also a loss of smoothness in a video image, such as a frame-by-frame video image called jerkiness.

To solve such problems, an image pickup apparatus according to an embodiment of the present invention has two holding units in one pixel. The two holding units alternately hold signal charge generated in a photoelectric conversion unit for each frame period. This configuration enables signal charge generated in the photoelectric conversion unit to be transferred to and held in one of the holding units while being read out from the other holding unit. That is, holding of signal charge and reading of signal charge can be performed at the same time. As a result, a period in which signal charge is not accumulated so that information is lost can be eliminated without an increase of the storage capacity of the photoelectric conversion unit.

An image pickup apparatus according to another embodiment of the present invention includes an overflow transistor that discharges signal charge accumulated in a photoelectric conversion unit, and adjusts the lengths of a plurality of accumulation periods dispersed in one frame by controlling the overflow transistor. With this configuration, advantages similar to those obtained by spuriously adjusting sensitivity of the photoelectric conversion unit can be obtained.

Preferred embodiments of the present invention will now be described in detail in accordance with the accompanying drawings.

First Embodiment

Figure 1:
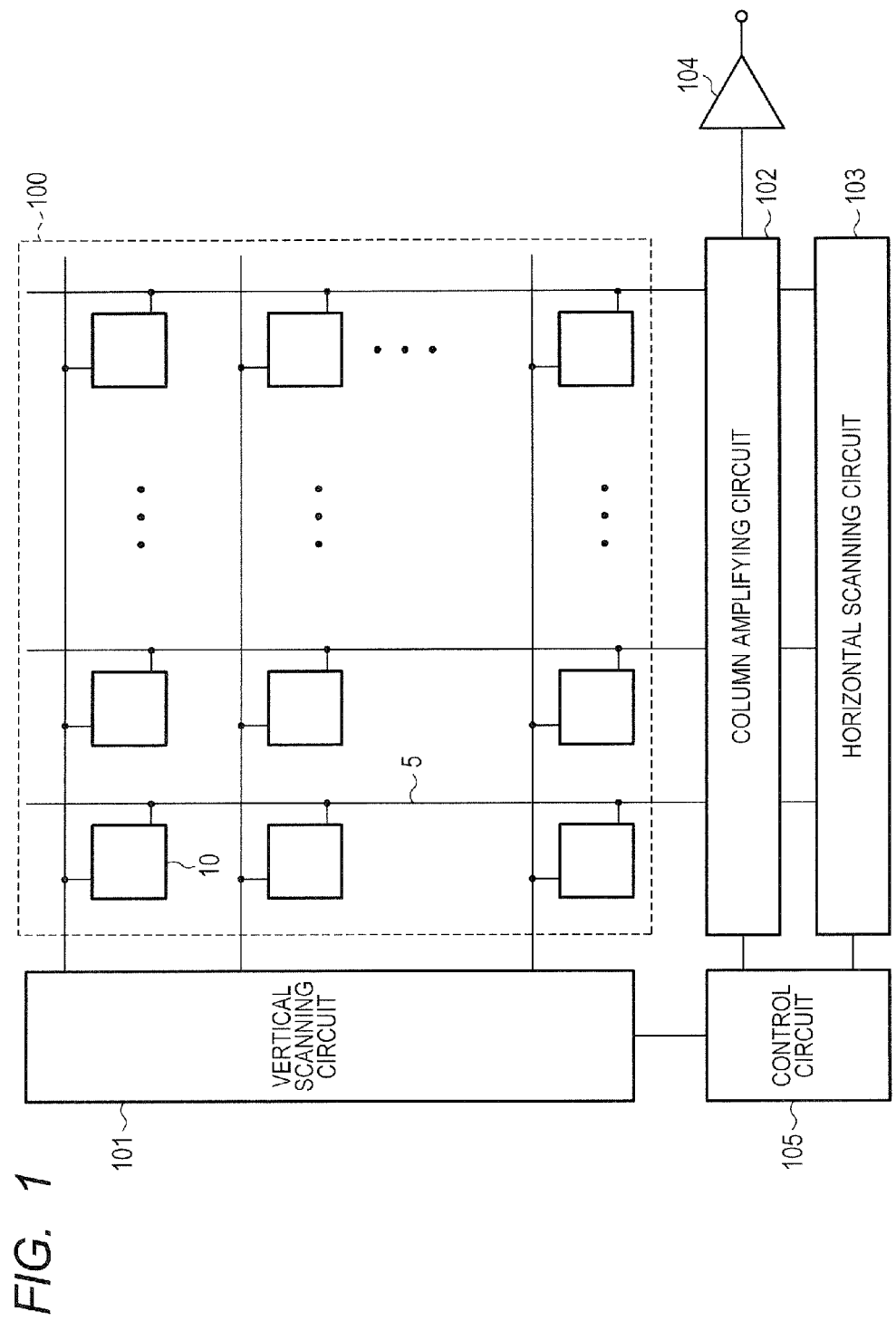
FIG. 1 is a block diagram schematically illustrating a configuration of an image pickup apparatus according to a first embodiment of the present invention.

FIG. 1 is a block diagram schematically illustrating a configuration of an image pickup apparatus according to this embodiment. The image pickup apparatus includes a pixel section 100, a vertical scanning circuit 101, a column amplifying circuit 102, a horizontal scanning circuit 103, an output circuit 104, and a control circuit 105. The pixel section 100 includes a plurality of pixels 10 arranged in rows and columns. The vertical scanning circuit 101 supplies control signals for controlling a plurality of transistors included in the pixels 10 between on (conductive state) and off (nonconductive state). For each column of the pixels 10, a column signal line 5 is provided so that signals from the pixels 10 are read out to the column signal line 5 in each column. The column amplifying circuit 102 amplifies pixel signals output to the column signal line 5, and performs processing such as correlated double sampling based on signals in resetting the pixels 10 and signals in photoelectric conversion. The horizontal scanning circuit 103 supplies a signal for controlling switches on or off which are connected to amplifiers of the column amplifying circuit 102. The output circuit 104 includes, for example, a buffer amplifier and a differential amplifier, and outputs a pixel signal from the column amplifying circuit 102 to a signal processor outside the image pickup apparatus. The column amplifying circuit 102 in the image pickup apparatus may include a function of a signal processing circuit for performing signal processing such as correction of an alias component. The image pickup apparatus may further include an AD converter so that the image pickup apparatus outputs a digital pixel signal.

Figure 2:
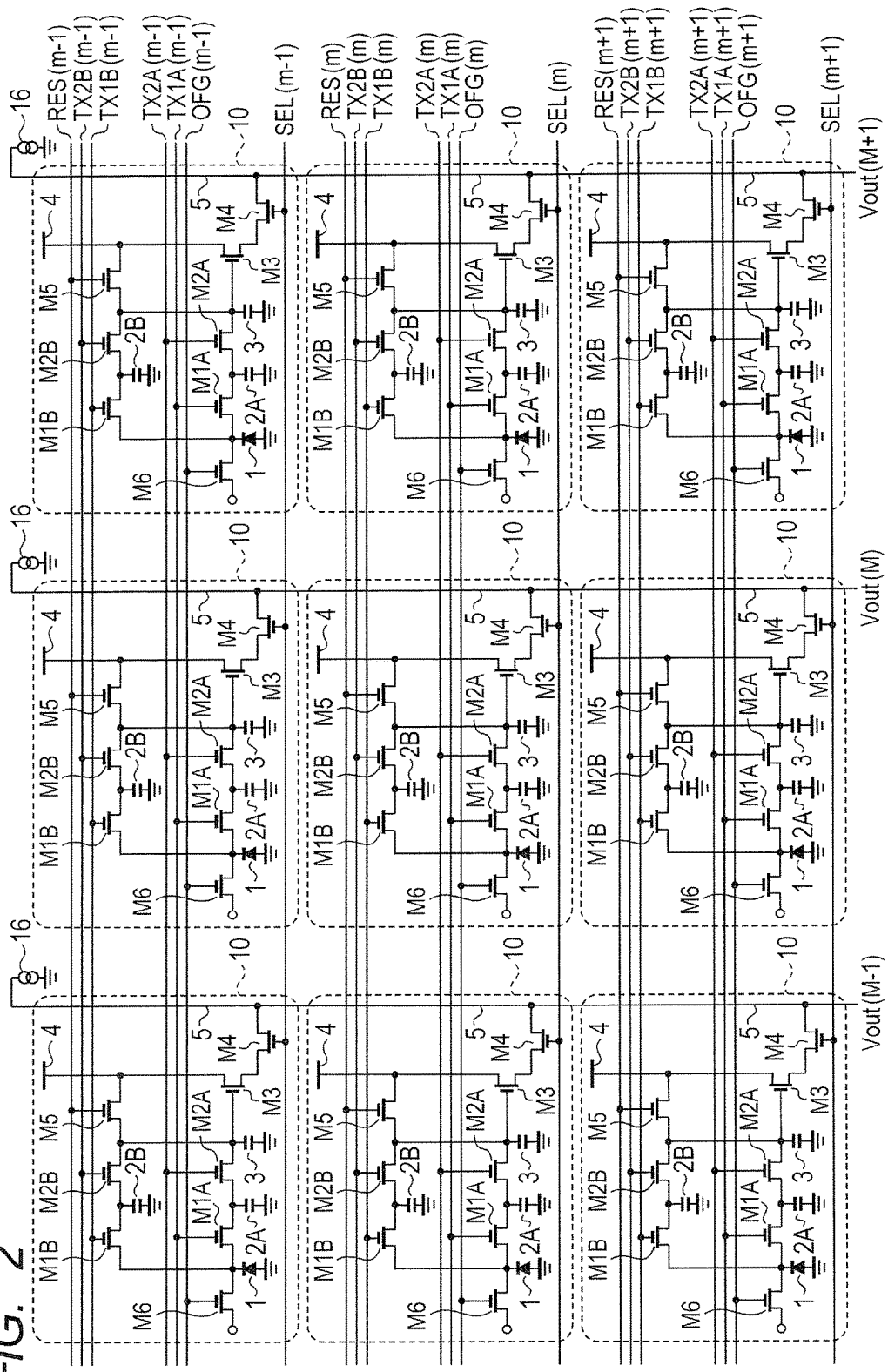
FIG. 2 is a diagram of an equivalent circuit of pixels in the image pickup apparatus according to the first embodiment of the present invention.

FIG. 2 shows an equivalent circuit of pixels 10 in the image pickup apparatus according to this embodiment. FIG. 2 illustrates nine pixels 10 in three rows and three columns among the pixels 10 arranged in two dimensions in the row and column directions. This configuration, however, is an example showing some of the pixels 10, and the image pickup apparatus can include much more pixels. Each of the pixels 10 includes a photoelectric conversion unit 1, a first holding unit 2A, a second holding unit 2B, a floating diffusion unit 3, a first transfer transistor M1A, a second transfer transistor M1B, a third transfer transistor M2A, and a fourth transfer transistor M2B. Each of the pixels 10 also includes an amplifying transistor M3, a select transistor M4, a reset transistor M5, and an overflow transistor M6.

The photoelectric conversion unit 1 performs photoelectric conversion on incident light and accumulates signal charge generated by photoelectric conversion. The first transfer transistor M1A (first transfer switch) transfers signal charge of the photoelectric conversion unit 1 to the first holding unit 2A when being turned on. The second transfer transistor M1B (second transfer switch) transfers signal charge of the photoelectric conversion unit 1 to the second holding unit 2B when being turned on. The first holding unit 2A and the second holding unit 2B hold signal charge transferred from the photoelectric conversion unit 1. The third transfer transistor M2A (third transfer switch) and the fourth transfer transistor M2B (fourth transfer switch) transfer charge from the first holding unit 2A and the second holding unit 2B, respectively, to the floating diffusion unit 3 of the amplifying transistor M3 when being turned on. The amplifying transistor M3 has drain connected to a supply voltage line 4 and source connected to the column signal line 5 through the select transistor M4. The column signal line 5 is connected to a constant current generator 16. An output signal Vout is output to the column amplifying circuit 102 through the column signal line 5 in each column. The reset transistor M5 (reset switch) resets the voltage of the floating diffusion unit 3 when being turned on. The overflow transistor M6 (discharge switch) has source connected to the photoelectric conversion unit 1, drain connected to a power supply node, and gate that receives a control signal OFG. When the overflow transistor M6 is turned on, charge of the photoelectric conversion unit 1 can be discharged to an overflow drain such as the power supply node. When the overflow transistor M6 is controlled from on to off, accumulation of charge by the photoelectric conversion unit 1 starts. In this manner, the length of the accumulation period can be freely set.

In the following description, the floating diffusion unit 3, the amplifying transistor M3, the select transistor M4, and the reset transistor M5 will be sometimes collectively referred to as an output unit. The floating diffusion unit 3 and the amplifying transistor M3 function as an amplifying unit that outputs a voltage based on transferred charge. Signal charge obtained from incident light by photoelectric conversion in the photoelectric conversion unit 1 will be referred to as real signal charge. On the other hand, charge generated by photoelectric conversion occurring in a part except the photoelectric conversion unit 1, such as the first holding unit 2A or the second holding unit 2B, and charge of a noise component such as charge caused by leakage of charge will be referred to as alias charge and are distinguished from the real signal charge in the following description. Alias charge generated in the first holding unit 2A will be sometimes referred to as first alias charge, and alias charge generated in the second holding unit 2B will be sometimes referred to as second alias charge.

A signal of the floating diffusion unit 3 may be read out with no select transistor M4 provided. The overflow transistor M6 is not necessarily provided, and may be omitted. In the case of omitting the overflow transistor M6, the first transfer transistor M1A is controlled from on to off so that accumulation of charge in the photoelectric conversion unit 1 starts, and the length of the accumulation period can be set. With this configuration, although the operating method of each transistor for setting the length of the accumulation period is limited, the number of devices is reduced so that flexibility of layout is enhanced.

As another modified example, a configuration called a vertical overflow in which charge from the photoelectric conversion unit is discharged to a semiconductor substrate may be employed. In this configuration, the number of devices disposed on the substrate surface is reduced so that flexibility of layout can be enhanced.

A common control signal is supplied from the vertical scanning circuit 101 to the pixels 10 arranged in the same row. That is, a control signal TX1A(m) is supplied to the gate of the first transfer transistor M1A included in each of the pixels 10 arranged in the (m)th row. Similarly, a control signal TX1B(m) is supplied to the gates of the second transfer transistors M1B in the (m)th row. A control signal TX2A(m) is supplied to the gates of the third transfer transistors M2A in the (m)th row. A control signal TX2B(m) is supplied to the gates of the fourth transfer transistors M2B in the (m)th row. A control signal SEL(m) is supplied to the gates of the select transistors M4 in the (m)th row. A control signal RES(m) is supplied to the gates of the reset transistors M5 in the (m)th row. A control signal OFG(m) is supplied to the gates of the overflow transistors M6 in the (m)th row. The index m of each control signal represents the number of row. In this specification, the index is added when it is necessary to identify a control signal of a specific row, and may not be added when such identification is unnecessary.

Each of these transistors is turned on when the corresponding control signal is at the high level, and turned off when the corresponding control signal is at the low level. By controlling the control signals in each row on or off at the same time, the image pickup apparatus can be controlled so that the accumulation period is substantially the same among the pixels 10. Such a configuration enables a global electronic shutter operation that causes periods of photoelectric conversion to substantially coincide with one another among a plurality of pixels.

In this embodiment, simultaneousness in making the accumulation period the same or coincide with one another only needs to be negligible in application. If a plurality of pixels 10 are driven completely at the same time, a heavy load is given on a driver, and thus, to reduce the load, a small time difference may be provided between some of the pixels 10. In the circuit illustrated in FIG. 2, each of the pixels 10 includes the amplifying unit, but one amplifying unit may be shared by a plurality of pixels 10. In addition to effective pixels such as the pixels 10 illustrated in FIG. 2, the pixel section 100 can include pixels that do not output signals for constituting an image, such as light-shielding pixels in which the photoelectric conversion units 1 are shielded from light and dummy pixels including no photoelectric conversion units 1.

Figure 3:
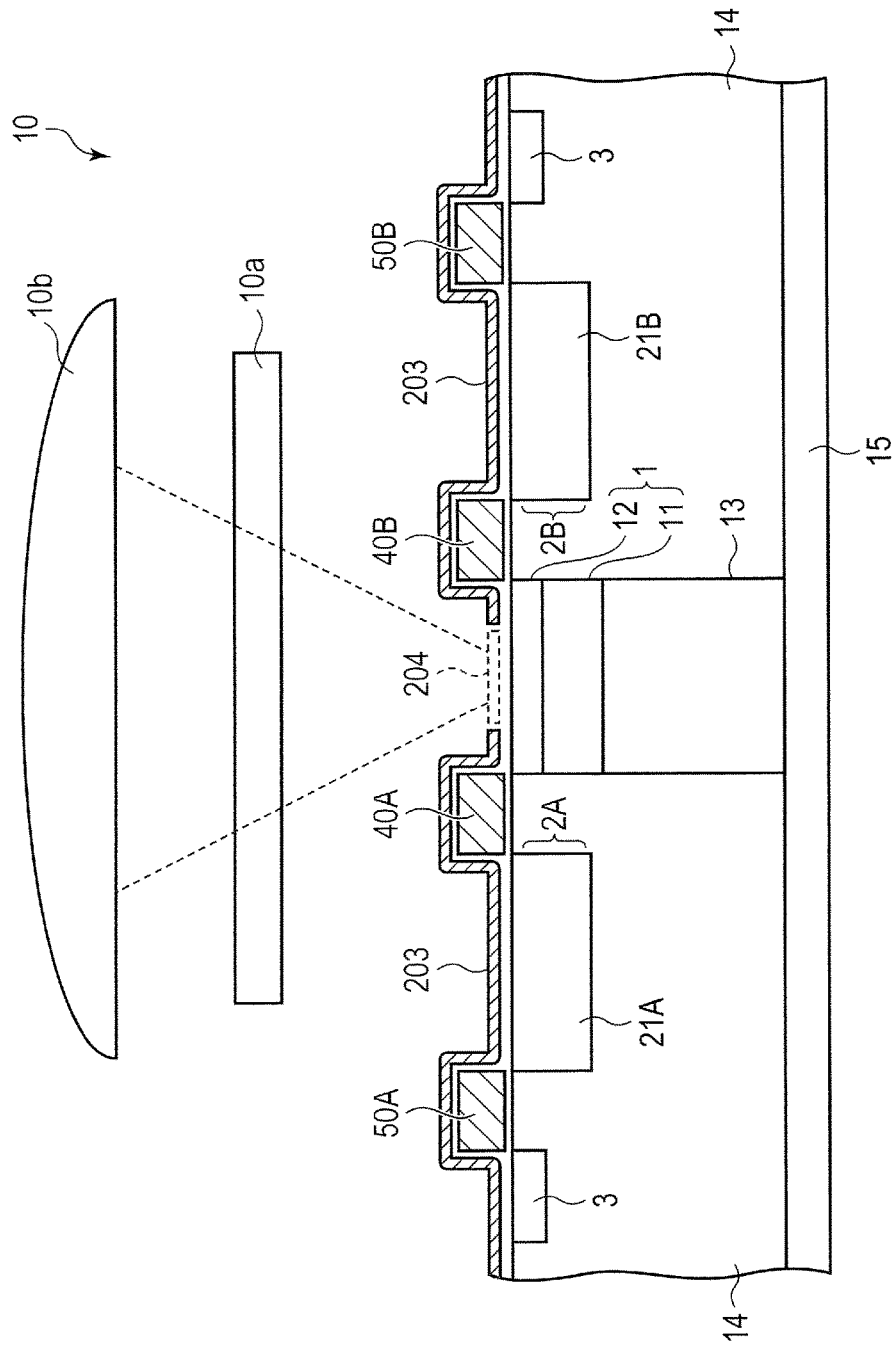
FIG. 3 schematically illustrates a cross-sectional configuration of a pixel in the image pickup apparatus according to the first embodiment of the present invention.

FIG. 3 schematically illustrates a cross-sectional configuration of the pixel 10 in the image pickup apparatus according to this embodiment.

The photoelectric conversion unit 1 is disposed in a P-type well region 14, and includes an N-type semiconductor region 11 and a P-type semiconductor region 12. The semiconductor region 11 and the semiconductor region 12 form a PN junction, and constitute an embedded photodiode structure. Incident light is subjected to photoelectric conversion in the PN junction, and charge generated by the photoelectric conversion is accumulated in the N-type semiconductor region 11. At this time, since the PN junction interface is embedded in the substrate by the P-type semiconductor region 12, noise is reduced.

An N-type semiconductor region 13 is defined under the lower surface of the photoelectric conversion unit 1. The semiconductor region 13 has an impurity concentration lower than that of the semiconductor region 11 of the same N-type. In this manner, charge generated in a deep portion of the semiconductor substrate is captured by the semiconductor region 13, and thus, noise is reduced. The semiconductor region 13 may be of a P-type. In addition, a P-type semiconductor region 15 serving as a potential barrier against charge is disposed below the lower surface of the semiconductor region 13.

The first holding unit 2A and the second holding unit 2B include N-type semiconductor regions 21A and 21B, respectively, defined in the P-type well region 14. Charge transferred from the photoelectric conversion unit 1 is held in the semiconductor region 21A or 21B. In this embodiment, the semiconductor regions 21A and 21B have an impurity concentration higher than that of the semiconductor region 11 of the same N-type.

A gate electrode 40A is disposed above a portion of the well region 14 between the semiconductor region 12 and the semiconductor region 21A with a gate insulating film interposed therebetween, and constitutes the gate of the first transfer transistor M1A. A gate electrode 40B is disposed above a portion of the well region 14 between the semiconductor region 12 and the semiconductor region 21B with the gate insulating film interposed therebetween, and constitutes the gate of the second transfer transistor M1B. The first transfer transistor M1A and the second transfer transistor M1B are on while the voltages of the gate electrodes 40A and 40B, respectively, are a predetermined threshold or more. At this time, the first transfer transistor M1A transfers charge accumulated in the photoelectric conversion unit 1 to the first holding unit 2A, and the second transfer transistor M1B transfers charge accumulated in the photoelectric conversion unit 1 to the second holding unit 2B. On the other hand, the first transfer transistor M1A and the second transfer transistor M1B are off while the voltages of the gate electrodes 40A and 40B, respectively, are less than the predetermined threshold.

A gate electrode 50A is disposed above a portion of the well region 14 between the semiconductor region 21A and the floating diffusion unit 3 with the gate insulating film interposed therebetween, and constitutes the gate of the third transfer transistor M2A. A gate electrode 50B is disposed above a portion of the well region 14 between the semiconductor region 21B and the floating diffusion unit 3 with the gate insulating film interposed therebetween, and constitutes the gate of the fourth transfer transistor M2B. The third transfer transistor M2A and the fourth transfer transistor M2B are on while the voltages of the gate electrodes 50A and 50B, respectively, are a predetermined threshold or more. At this time, the third transfer transistor M2A transfers charge of the first holding unit 2A to the floating diffusion unit 3, and the fourth transfer transistor M2B transfers charge of the second holding unit 2B to the floating diffusion unit 3. On the other hand, the third transfer transistor M2A and the fourth transfer transistor M2B are off while the voltages of the gate electrodes 50A and 50B, respectively, are less than the predetermined threshold. When a negative voltage is applied to the gate electrodes 40A, 40B, 50A, and 50B, holes can be induced near the surface under a lower portion of the gate electrodes. In this manner, noise generated at the interface can be reduced.

Here, while the first transfer transistor M1A and the second transfer transistor M1B are on, leakage of charge from each of the semiconductor region 21A and the semiconductor region 21B can cause minute noise. On the other hand, while the first transfer transistor M1A and the second transfer transistor M1B are off, holes are induced near the surfaces of the semiconductor region 21A and the semiconductor region 21B, and thus, such noise can be reduced. Accordingly, the first transfer transistor M1A and the second transfer transistor M1B are preferably controlled to minimize the on period.

A light-shielding part 203 is made of a metal that hardly allows visible light to pass therethrough, such as tungsten or aluminium, and shields the semiconductor region including the first holding unit 2A and the second holding unit 2B against light. The light-shielding part 203 has an opening 204 above the photoelectric conversion unit 1. Above the opening 204, a color filter 10a that allows a part of visible light in a specific wave length range to pass therethrough and a microlens 10b that focuses incident light are disposed.

The floating diffusion unit 3 is shown as being divided into two left and right regions in FIG. 3, but is actually one region or electrically interconnected regions, and is one region in an equivalent circuit as illustrated in FIG. 2. Although the reset transistor M5, the overflow transistor M6, and other components are not shown but can be disposed on the same substrate as, for example, the photoelectric conversion unit 1. For example, the reset transistor M5, the overflow transistor M6, and other components can be disposed in, for example, a depth direction in FIG. 3. FIG. 3 shows a front surface irradiation type pixel 10 as an example of the configuration of the pixels 10, but the pixels 10 may be of a back surface irradiation type. The first holding unit 2A and the second holding unit 2B are formed on the P-type well region 14, but may be formed on an N-type well region. In this case, the N-type and the P-type are replaced by each other, and holes are held in the first holding unit 2A and the second holding unit 2B, instead of electrons. The high level and the low level of control signals supplied to the pixels 10 are also replaced by each other.

Figure 4:
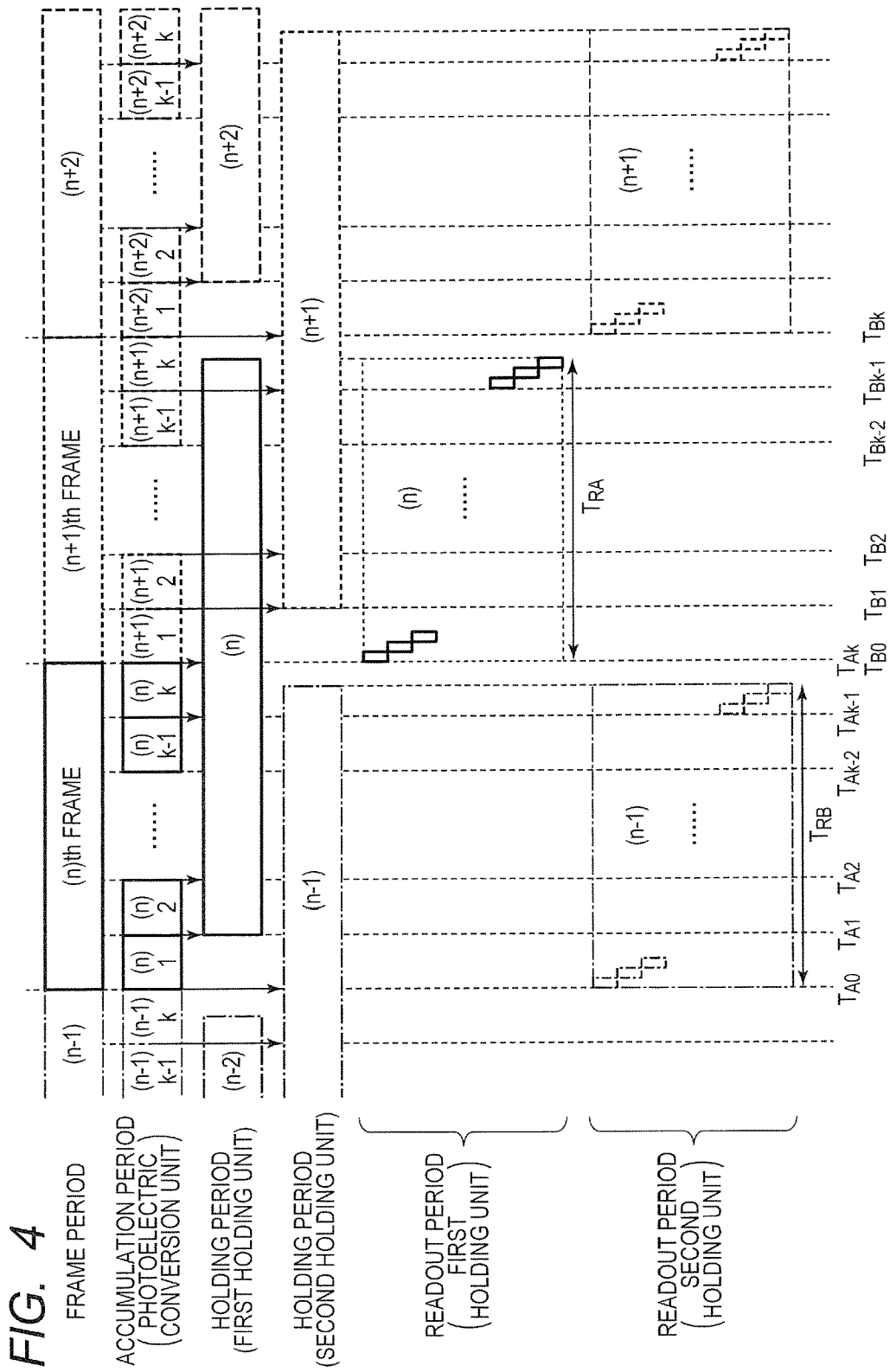
FIG. 4 schematically illustrates an operation of the image pickup apparatus according to the first embodiment of the present invention.

FIG. 4 schematically illustrates an operation of the image pickup apparatus according to this embodiment, and shows an image pickup operation from the (n)th frame to the (n+1)th frame. The numbers inside the parentheses represent the frame numbers. Specifically, "(n)" represents an operation concerning signal charge generated in the (n)th frame period.

FIG. 4 shows an accumulation period in which signal charge generated in each frame period is accumulated in the photoelectric conversion unit 1, a holding period in which the signal charge is held in the first holding unit 2A, a holding period in which the signal charge is held in the second holding unit 2B, a period $T_{RA}$ in which the signal charge is read out from the first holding unit 2A, and a period $T_{RB}$ in which the signal charge is read out from the second holding unit 2B. Here, the readout periods $T_{RA}$ and $T_{RB}$ are periods in which readout operation of the pixels 10 from the first holding unit 2A and the second holding unit 2B, respectively, is sequentially performed. The readout periods $T_{RA}$ and $T_{RB}$ include signal charge transfer periods using the third transfer transistor M2A and the fourth transfer transistor M2B and a signal output period using the amplifying transistor M3. Operations of these transistors are controlled based on control signals output from the vertical scanning circuit 101. An operation of the pixels 10 in the image pickup apparatus according to this embodiment will now be described with reference to FIG. 4.

In this embodiment, signal charge corresponding to one frame and generated in the photoelectric conversion unit 1 is divided into k parts to be sequentially transferred from the photoelectric conversion unit 1 to the first holding unit 2A or the second holding unit 2B. Numbers 1 through k representing the order of accumulation periods in the frame period are shown under the frame numbers of the accumulation periods. When the overflow transistor M6 is turned off at time $T_{A0}$, the photoelectric conversion unit 1 starts the first accumulation period in an (n)th frame. Accordingly, signal charge generated in accumulation periods $T_{A0}$ through $T_{A1}$ of the first signal charge is accumulated in the photoelectric conversion unit 1 of each pixel 10. Thereafter, when the first transfer transistors M1A are turned on and off at the same time in a plurality of pixels 10 at time $T_{A1}$, signal charge accumulated in the photoelectric conversion unit 1 is transferred to the first holding unit 2A in a standby state.

Similarly, at subsequent times $T_{A2}, \ldots,$ and $T_{Ak}$, signal charge generated in each accumulation period is transferred to the first holding units 2A at the same time in a plurality of pixels 10. In FIG. 4, transfer timings are represented as arrows. When signal charge generated in k accumulation periods $T_{Ak-1}$ through $T_{Ak}$ in the (n)th frame is transferred to the first holding unit 2A, the (n)th frame is finished. In FIG. 4, the lengths of the k accumulation periods are the same. The present invention, however, is not limited to this example, and the lengths of the accumulation periods may be different from one another.

On the other hand, the second holding unit 2B at time $T_{A0}$ holds signal charge generated in the photoelectric conversion unit 1 in the previous (n−1)th frame period. When the fourth transfer transistors M2B of pixels 10 in each row are sequentially turned on, signal charge held by the second holding units 2B in the row is sequentially transferred to the floating diffusion units 3. At the same time, the column amplifying circuit 102 sequentially reads pixel signals based on signal charge transferred to the floating diffusion units 3 through output units of the pixels 10. The second holding units 2B in each row sequentially become standby states when signal charge held therein is read out. In this manner, signal charge generated in the (n−1)th frame period and held in the second holding units 2B is read out in the readout period $T_{RB}$ in the (n)th frame period shown in FIG. 4.

Subsequently, when the overflow transistors M6 are turned off at time $T_{B0}$, the photoelectric conversion unit 1 starts the first accumulation period in the next (n+1)th frame. Then, an image pickup operation similar to that in the (n)th frame is repeatedly performed by alternately using the first holding units 2A and the second holding units 2B in each of frame periods of an (n+1)th frame period, an (n+2)th frame period, . . . . For example, signal charge generated in the (n)th frame period and held in the first holding units 2A is read out in the readout period $T_{RA}$ in the (n+1)th frame period shown in FIG. 4.

In this embodiment, in the manner described above, while signal charge generated by photoelectric conversion is accumulated in each photoelectric conversion unit 1, signal charge corresponding to one frame is divided into parts to be transferred from the photoelectric conversion unit 1 to the corresponding first holding unit 2A or the corresponding second holding unit 2B. With this configuration, the storage capacity of the photoelectric conversion unit can be made smaller than the holding capacity of each of the first holding unit 2A and the second holding unit 2B. Signal change can be most efficiently accumulated and held when the ratio of the storage capacity of the photoelectric conversion unit and the holding capacity of each of the first holding unit 2A and the second holding unit 2B is 1:k.

In this embodiment, signal charge generated in the photoelectric conversion unit is alternately held in the first holding unit 2A and the second holding unit 2B for each frame period. In this manner, while signal charge generated in the photoelectric conversion unit 1 is transferred to one of the holding units, signal charge can be read out from the other holding unit. That is, holding of signal charge and reading of signal charge can be performed at the same time. As a result, a period in which signal charge is not accumulated so that information is lost can be eliminated without an increase of the storage capacity of the photoelectric conversion unit.

FIG. 4 shows an operation example in which reading is sequentially performed from the pixels 10 in the first row. The present invention, however, is not limited to this example, and the reading only needs to be performed at least once on each pixel 10 and is not limited to a specific order.

Figure 5:
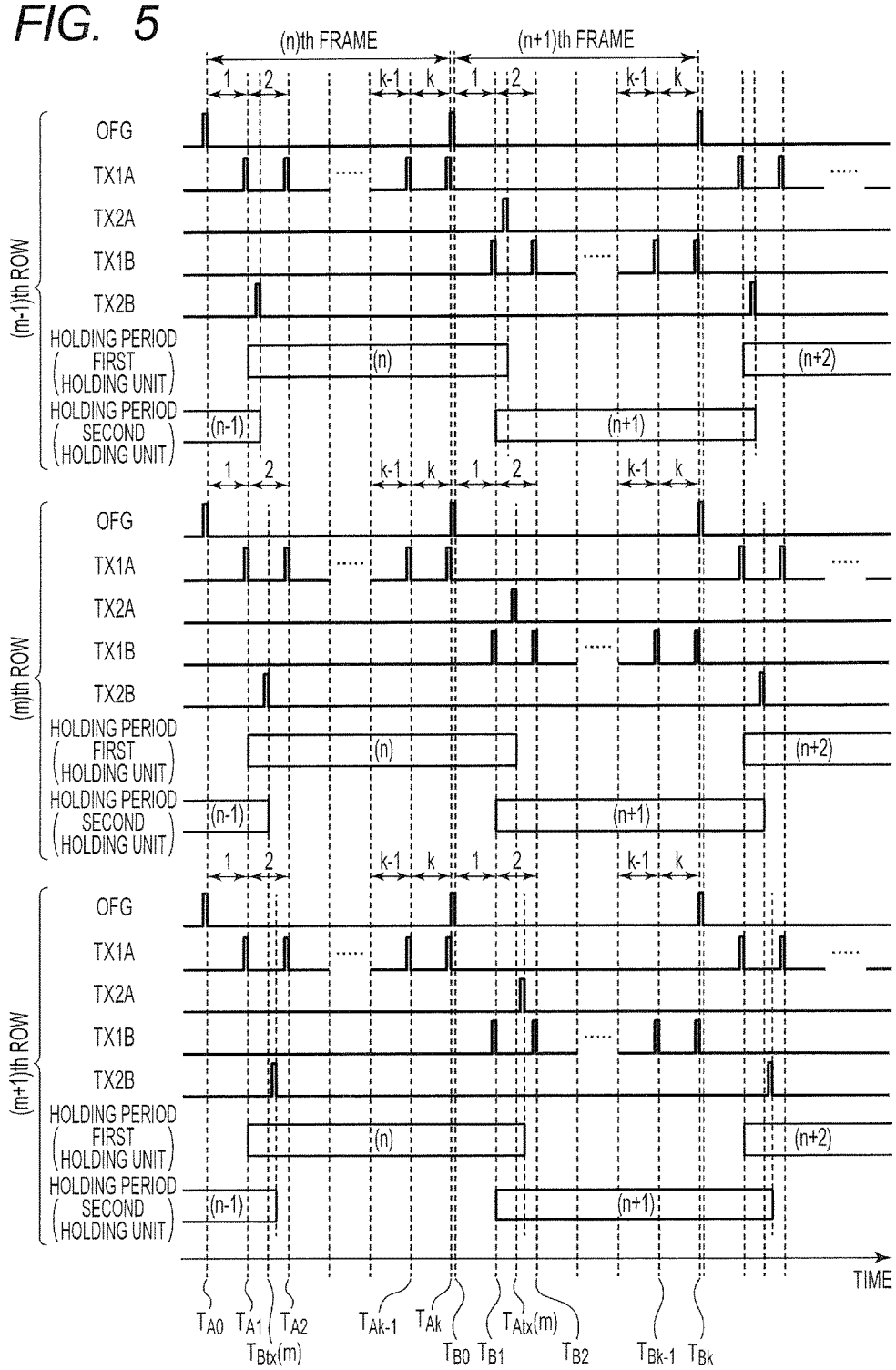
FIG. 5 is a timing chart of a control signal in the image pickup apparatus according to the first embodiment of the present invention.

FIG. 5 is a timing chart of the image pickup apparatus according to this embodiment, and a timing chart of control signals output from the vertical scanning circuit 101. FIG. 5 shows control signals OFG, TX1A, TX1B, TX2A, and TX2B for controlling pixels 10 in the (m−1)th through the (m+1)th rows in particular. Similar operation is performed with control signals in rows except the (m−1)th through the (m+1)th rows. In a manner similar to that in FIG. 4, the numbers inside the parentheses represent the frame numbers. For example, "(n)" represents an operation concerning signal charge generated in the (n)th frame period. Numbers 1 through k representing the order of accumulation periods in the frame period are shown under the frame numbers of the accumulation periods.

As described above, the control signal OFG is applied to the gate of the overflow transistor M6. The control signals TX1A, TX1B, TX2A, and TX2B are applied to the gates of the first transfer transistor M1A, the second transfer transistor M1B, the third transfer transistor M2A, and the fourth transfer transistor M2B, respectively. When the vertical scanning circuit 101 changes a control signal to the high level, the corresponding transistor is turned on, whereas when the vertical scanning circuit 101 changes the control signal to the low level, the corresponding transistor is turned off.

When the overflow transistor M6 is on for a predetermined period before time $T_{A0}$ and is turned off at time $T_{A0}$ based on the control signal OFG, signal charge accumulated in the photoelectric conversion unit 1 and remaining charge are discharged, and the first accumulation period in the (n)th frame starts. Subsequently, when the first transfer transistor M1A is turned on and off at times $T_{A1}$ $T_{A2}$, . . . , and $T_{Ak}$ a predetermined transfer times of k based on the control signal TX1A, signal charge generated in accumulation periods in the (n)th frame is transferred to the first holding unit 2A.

On the other hand, in the (n)th frame period from time $T_{A0}$ to time $T_{AK}$, when the fourth transfer transistors M2B of pixels 10 in each row are sequentially turned on based on the control signal TX2B, signal charge held by the second holding units 2B in the row is sequentially transferred to the floating diffusion units 3 and read out. FIG. 5 shows a timing $T_{Btx}(m)$ when the fourth transfer transistors M2B in the pixels 10 in the (m)th row are turned off after having been turned on. Since reading from the second holding units 2B in each row is sequentially performed, the timing of turning the fourth transfer transistors M2B off differs between the (m)th row and the (m+1)th row.

When reading from the second holding units 2B in each row in the (n)th frame period is finished, the overflow transistors M6 are turned on for a predetermined period before time $T_{B0}$ and turned off at time $T_{B0}$ based on the control signal OFG. In this manner, signal charge accumulated in the photoelectric conversion units 1 and remaining charge are discharged, and the first accumulation period in the next (n+1)th frame starts. Thereafter, an image pickup operation similar to that in the (n)th frame is repeatedly performed by alternately using the first holding units 2A and the second holding units 2B in each of frame periods of an (n+1)th frame period, an (n+2)th frame period, . . . .

Figure 6:
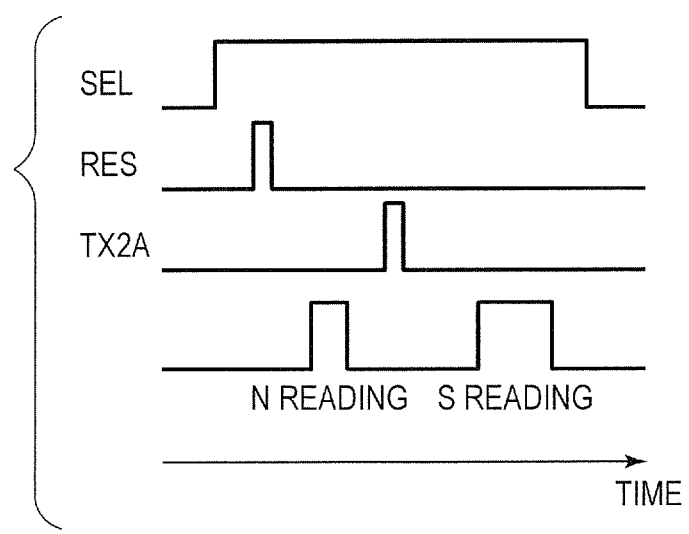
FIG. 6 is a timing chart of a readout operation of pixel signals in the image pickup apparatus according to the first embodiment of the present invention.

FIG. 6 is a timing chart of control signals according to this embodiment, and shows a readout operation of pixel signals. A readout operation corresponding to one row and performed on the first holding units 2A will now be described. A readout operation performed on the second holding units 2B will be understood by rendering the third transfer transistor M2A, the control signal TX2A, and the first holding unit 2A as the fourth transfer transistor M2B, the control signal TX2B, and the second holding unit 2B, respectively, and thus, description thereof will now be repeated.

FIG. 6 shows a control signal SEL to be supplied to the select transistor M4, a control signal RES to be supplied to the reset transistor M5, a control signal TX2A to be supplied to the third transfer transistor M2A. Each of the third transfer transistor M2A, the select transistor M4, and the reset transistor M5 is turned on when the corresponding control signal is at the high level, and is turned off when the corresponding signal is at the low level.

A readout operation of a pixel signal will now be described with reference to FIGS. 1 and 6. First, the vertical scanning circuit 101 sets the control signal SEL at the high level to turn the select transistors M4 on, and selects pixels 10 from which signals are to be read out. Next, the vertical scanning circuit 101 sets the control signal RES at the high level to turn the reset transistors M5 on. By turning the reset transistors M5 on, the voltage of the floating diffusion units 3 is reset to a power supply voltage. After the reset transistors M5 have been turned off, the column amplifying circuit 102 performs reading of pixel signals in resetting (N reading) from the column signal line 5. The vertical scanning circuit 101 sets the control signal TX2A at the high level to turn the third transfer transistors M2A on, and transfers signal charge of the first holding units 2A to the floating diffusion units 3. The column amplifying circuit 102 performs reading of pixel signals (S reading) from the column signal line 5. The thus-read pixel signals are subjected to correlated double sampling in the column amplifying circuit 102 or the output circuit 104, and output from the output circuit 104. The correlated double sampling may be performed after AD conversion of the pixel signals.

As described above, in this embodiment, signal charge generated in the photoelectric conversion unit is alternately held in the first holding units or the second holding units for each frame period, and in a period in which no signal charge is transferred from the photoelectric conversion units, signal charge is output to the output units. In this manner, an image pickup apparatus and a method for controlling an image pickup apparatus that can capture a high-quality video image with a long accumulation period can be obtained without an increase in the pixel size.

The image pickup apparatus according to this embodiment can obtain excellent advantages especially in a global electronic shutter operation, but the present invention is not limited to this operation. For example, an operation mode of a rolling shutter may be employed. The rolling shutter is an operation mode in which charge accumulation by the photoelectric conversion units 1 of pixels sequentially starts for each row or for a plurality of rows. Thereafter, the first transfer transistors M1A and the second transfer transistors M1B of the pixels 10 are sequentially controlled on for each row or for a plurality of rows.

Second Embodiment

An image pickup apparatus according to the second embodiment will now be described. In the first embodiment described above, the overflow transistor M6 is kept off from the start to the end of one frame period. On the other hand, in the second embodiment, an overflow transistor M6 is turned on and off several times in one frame period so that the length of an accumulation period of a photoelectric conversion unit 1 is adjusted. The following description will be given mainly on a portion of a configuration different from that of the first embodiment, and part of the configuration similar to that of the first embodiment will not be described again.

Figure 7:
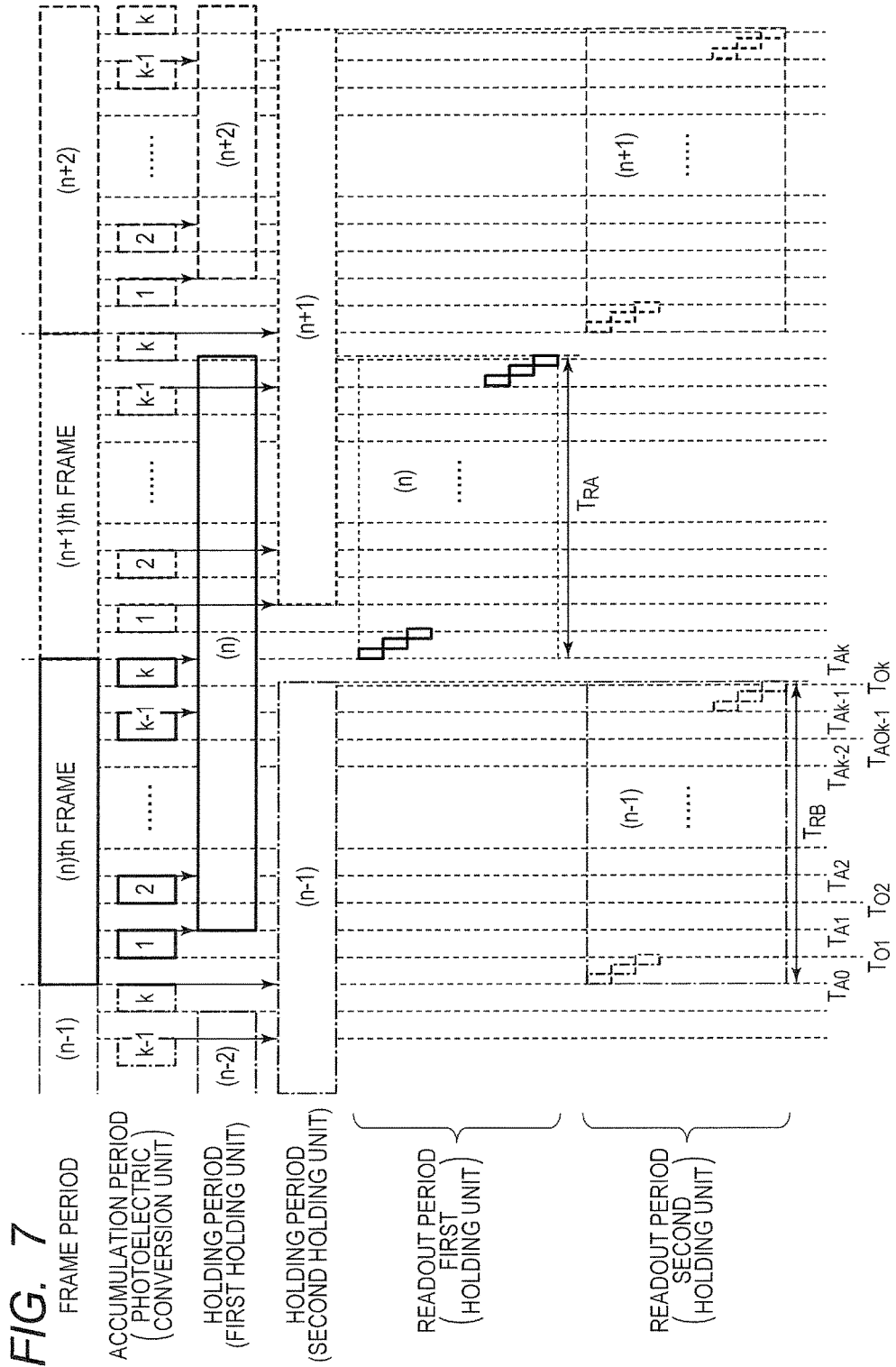
FIG. 7 schematically illustrates an operation of an image pickup apparatus according to a second embodiment of the present invention.
Figure 8:
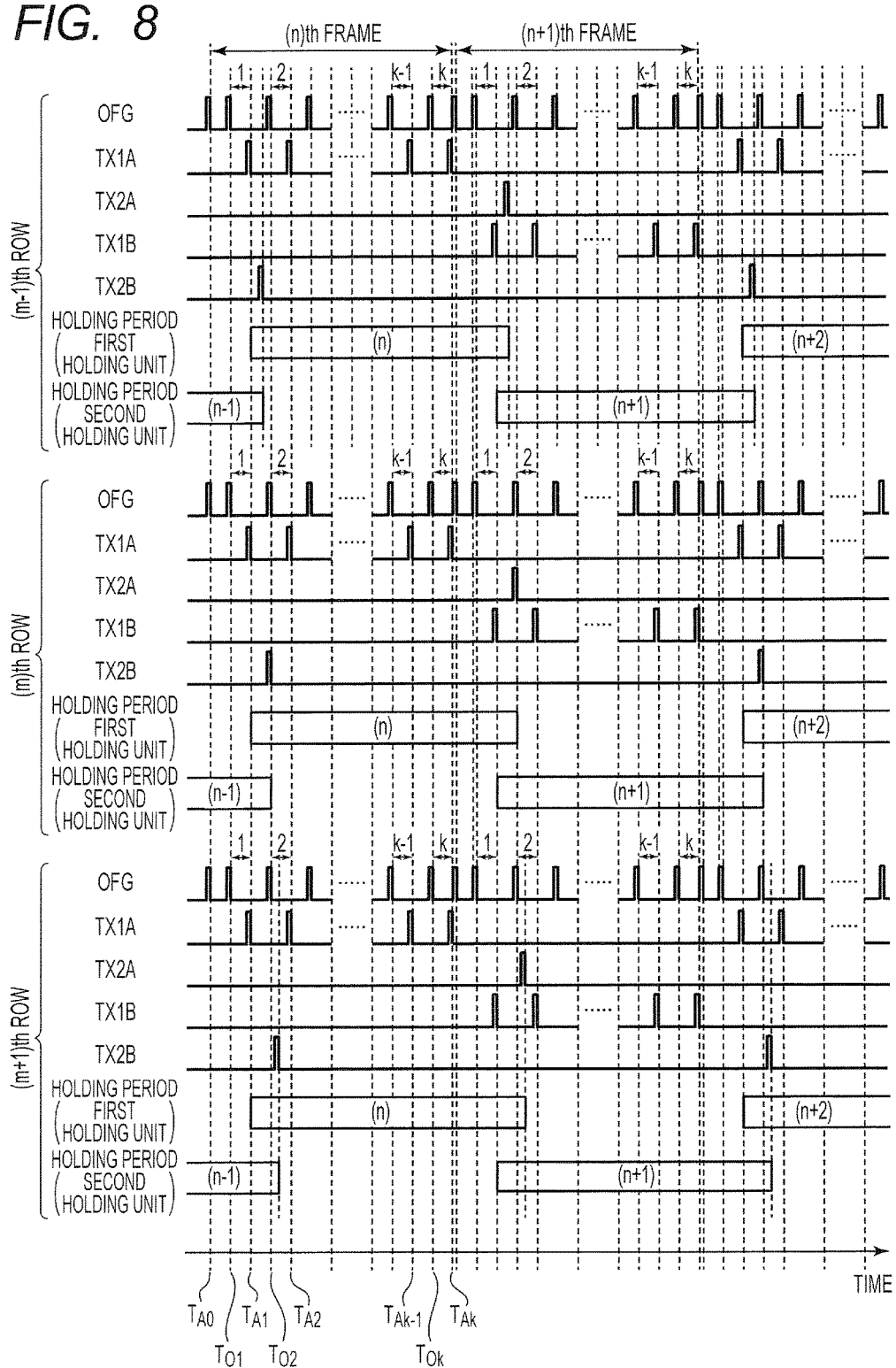
FIG. 8 is a timing chart of control signals in the image pickup apparatus according to the second embodiment.

FIG. 7 schematically illustrates an operation of the image pickup apparatus according to this embodiment. FIG. 8 is a timing chart of the image pickup apparatus according to this embodiment. The timing charts of this embodiment illustrated in FIGS. 7 and 8 are different from the timing charts of the first embodiment illustrated in FIGS. 4 and 5 in that the overflow transistor M6 is turned on and off several times in one frame period. Specifically, in the first accumulation period of an (n)th frame period, the overflow transistor M6 is turned on before time $T_{O1}$ and turned off at time $T_{O1}$. In a period before time $T_{O1}$ to time $T_{O1}$ in which the overflow transistor M6 is on, signal charge generated in the photoelectric conversion unit 1 is discharged to an overflow drain, and thus, the timing of start of the first accumulation period can be delayed from time $T_{A0}$ to time $T_{O1}$. Similar operations are performed in the second and subsequent accumulation periods. In this manner, the length of the accumulation period can be adjusted.

In this embodiment, a plurality of accumulation periods are dispersed in one frame period and the lengths of the accumulation periods are adjusted. Thus, even in a case where instantaneous strong noise occurs in one of the accumulation periods, this noise does not affect the other accumulation periods. For example, even when the storage capacity of the photoelectric conversion unit 1 overflows in one accumulation period because of unsteady incident light called flicker or instantaneous strong light such as flash, signal charge can be normally accumulated in the other accumulation periods. In this manner, in this embodiment, durability to instantaneous strong noise can be enhanced.

As described above, in this embodiment, the overflow transistor for discharging charge accumulated in the photoelectric conversion unit is provided. In addition, an accumulation period is controlled as a period from when the overflow transistor is turned off to when a first transfer transistor or a second transfer transistor is turned on. In this manner, the length of the accumulation period of the photoelectric conversion unit can be dynamically adjusted.

Third Embodiment

An image pickup apparatus according to a third embodiment will now be described. In this embodiment, a method for adjusting the length of an accumulation period of a photoelectric conversion unit 1 by controlling an overflow transistor M6 different from the method of the second embodiment will be described. The following description will be given mainly on a portion of a configuration different from that of the second embodiment, and part of the configuration similar to that of the second embodiment will not be described again.

Figure 9:
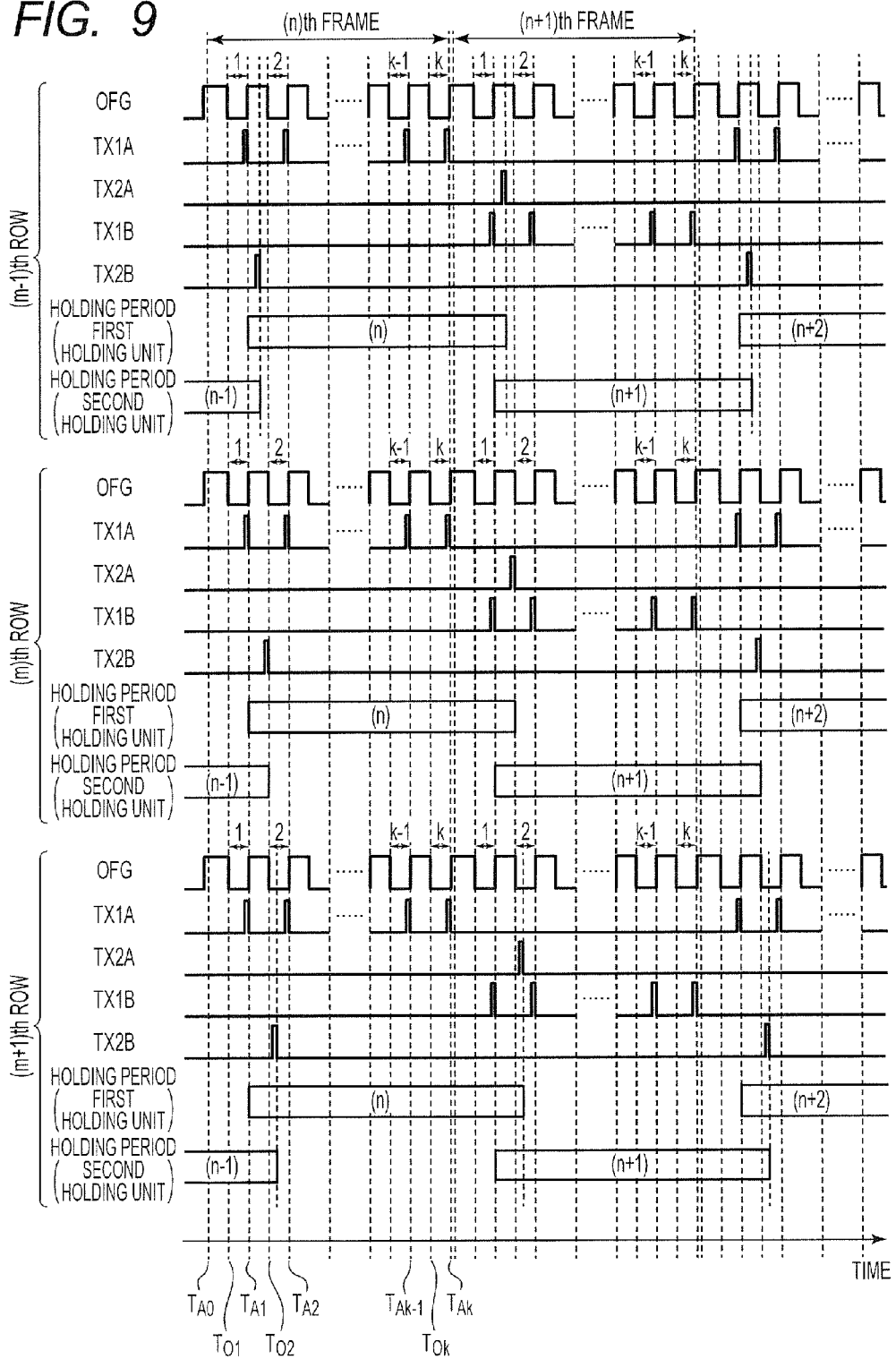
FIG. 9 is a timing chart of control signals in an image pickup apparatus according to a third embodiment of the present invention.

FIG. 9 is a timing chart of the image pickup apparatus according to the third embodiment. The timing chart of this embodiment illustrated in FIG. 9 is different from the timing chart of the second embodiment illustrated in FIG. 8 in that a period in which the overflow transistor M6 is turned on is increased. Specifically, in the first accumulation period of an (n)th frame period, the overflow transistor M6 is turned on before time $T_{A0}$ and turned off at time $T_{O1}$. In a period before time $T_{A0}$ to time $T_{O1}$ in which the overflow transistor M6 is on, signal charge generated in a photoelectric conversion unit 1 is discharged to an overflow drain, and thus, the timing of start of the first accumulation period can be delayed from time $T_{A0}$ to time $T_{O1}$. Similar operations are performed in the second and subsequent accumulation periods.

In FIG. 9, the overflow transistor M6 is turned on at time $T_{A1}$, and the first accumulation period is finished at time $T_{A1}$. At this time, the timing of end of the first accumulation period can be made earlier than time $T_{A1}$ by turning the overflow transistor M6 on before time $T_{A1}$. Similar operations are performed in the second and subsequent accumulation periods. In this manner, the length of the accumulation period can be adjusted.

For example, when very strong light such as sunlight is generated while the overflow transistor M6 is off, a large amount of charge is generated in the photoelectric conversion unit 1 and overflows therefrom, and leaks into a first holding unit 2A or a second holding unit 2B to serve as an alias and degrade image quality. In this embodiment, since the period in which the overflow transistor M6 is on is longer than that in the second embodiment, degradation of image quality caused by such an alias can be suppressed.

In addition, in this embodiment, since a plurality of accumulation periods are dispersed in one frame period, the amount of charge accumulated in one frame period can be substantially uniformly increased or reduced in terms of time by uniformly increasing or reducing the lengths of the plurality of accumulation periods. That is, the same advantages as those obtained by spuriously adjusting sensitivity of the photoelectric conversion unit can be obtained.

In this manner, for example, a plurality of images having different sensitivities are created by changing the length of the accumulation period for each frame and these images are synthesized so that a high dynamic range (HDR) image can be obtained. At this time, for example, the lengths of accumulation periods may be gradually varied among frames with the upper limit provided in the variation range of the lengths of the accumulation periods among the frames. In this case, an abrupt change of spurious sensitivity of photoelectric conversion units can be reduced.

The sensitivity of the photoelectric conversion units can be adjusted by providing ND filters or the like in the image pickup apparatus. In this case, however, costs increase by a degree corresponding to the number of necessary ND filters. Instead of providing ND filters, the quantity of light can be adjusted by using a diaphragm. In the case of adjustment using the diaphragm, however, the depth of field changes so that unnaturalness might occur in a video image. In this embodiment, the sensitivity of the photoelectric conversion unit can be adjusted only by controlling the overflow transistor, and thus, no ND filters need to be added, and costs for the image pickup apparatus can be reduced.

As described above, in this embodiment, the accumulation period is controlled as a period from when the overflow transistor is turned off to when the overflow transistor is turned on. In this manner, the length of the accumulation period of the photoelectric conversion unit can be dynamically adjusted.

Fourth Embodiment

Figure 10:
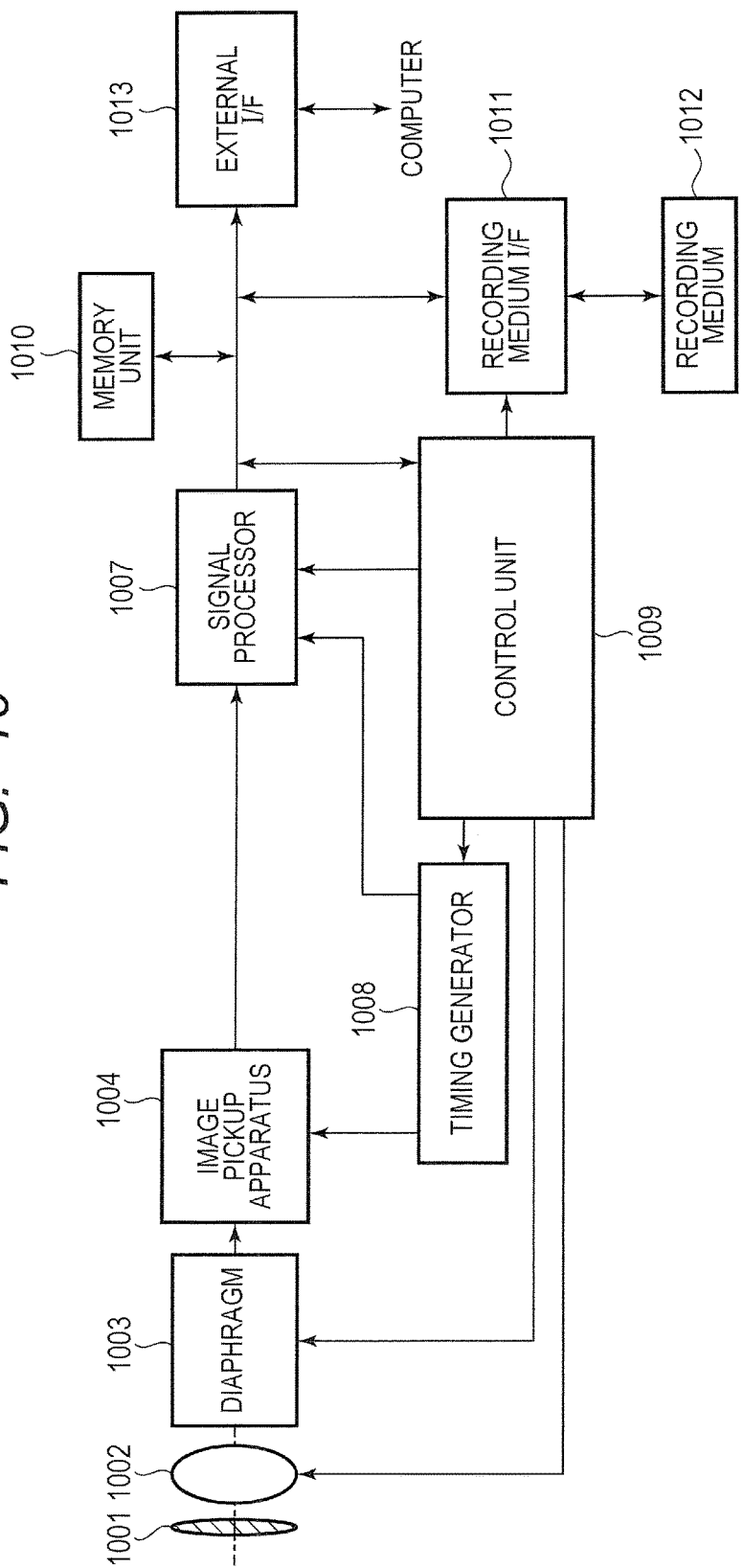
FIG. 10 is a block diagram of an image pickup system according to a fourth embodiment of the present invention.

An image pickup system according to a fourth embodiment will be described with reference to FIG. 10. The image pickup system according to this embodiment includes the image pickup apparatus according to one of the first through third embodiments, and is typified by a digital still camera, a digital camcorder, a copying machine, a facsimile, a cellular phone, a vehicle-mounted camera, and an observation satellite. The image pickup system includes a camera module including an optical system such as a lens and an image pickup apparatus. FIG. 10 is a block diagram of a digital still camera as an example of the image pickup system. The image pickup system illustrated in FIG. 10 includes a lens protection barrier 1001, a lens 1002, a diaphragm 1003, an image pickup apparatus 1004, and a signal processor 1007. The image pickup system also includes a timing generator 1008, a control unit 1009, a memory unit 1010, a recording medium I/F 1011, a recording medium 1012, and an external I/F 1013.

The lens protection barrier 1001 protects the lens 1002. The lens 1002 forms an optical image of an object in the image pickup apparatus 1004. The diaphragm 1003 changes the quantity of light that has passed through the lens 1002. The image pickup apparatus 1004 is one of the image pickup apparatuses described in the first through third embodiments, and converts the optical image formed by the lens 1002 to image data. The signal processor 1007 performs various corrections and data compression on the captured image data output from the image pickup apparatus 1004. The timing generator 1008 outputs various timing signals to the image pickup apparatus 1004 and the signal processor 1007. The control unit 1009 controls the entire digital still camera. The memory unit 1010 temporarily stores image data. The recording medium I/F 1011 performs recording or reading on the recording medium 1012. The recording medium 1012 is a demountable recording medium such as a semiconductor memory for recording or reading captured image data. The external I/F 1013 communicates with, for example, an external computer.

A timing signal may be supplied from outside the image pickup system. The image pickup system according to this embodiment only needs to include at least the image pickup apparatus 1004 and the signal processor 1007 for processing a captured image signal output from the image pickup apparatus 1004. The AD converter may be provided on the semiconductor substrate of the image pickup apparatus 1004 or may be provided on a semiconductor substrate different from the semiconductor substrate of the image pickup apparatus 1004. The image pickup apparatus 1004 and the signal processor 1007 may be formed on the same semiconductor substrate.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-116352, filed Jun. 10, 2016, which is hereby incorporated by reference herein in its entirety.

What is claimed is:

1. An image pickup apparatus comprising:
a plurality of pixels arranged in rows and columns, each of the plurality of pixels including:
a photoelectric conversion unit that accumulates a signal charge generated by photoelectric conversion of irradiated light;
a first holding unit and a second holding unit that hold the signal charge which is transferred from the photoelectric conversion unit;
an output unit that outputs, to a column signal line, a signal based on an amount of the signal charge held by the first holding unit or the second holding unit;
a first transfer transistor that transfers the signal charge from the photoelectric conversion unit to the first holding unit;
a second transfer transistor that transfers the signal charge from the photoelectric conversion unit to the second holding unit;
a third transfer transistor that transfers the signal charge from the first holding unit to the output unit; and
a fourth transfer transistor that transfers the signal charge from the second holding unit to the output unit; and a vertical scanning circuit that controls the first transfer transistor, the second transfer transistor, the third transfer transistor, and the fourth transfer transistor, wherein:

the photoelectric conversion unit has a storage capacity smaller than a holding capacity of each of the first holding unit and the second holding unit, the first holding unit holds the signal charge generated in a first frame period, the second holding unit holds the signal charge generated in a second frame period which is a period prior to the first frame period and not overlapping with the first frame period, the vertical scanning circuit is configured to transfer the signal charge generated in the first frame period to the first holding unit by plural times of transfer operations by turning on and off plural times the first transfer transistor in the first frame period, the first frame period includes:

a first period which is a period from a first time to a second time, wherein the first time is a timing in which the photoelectric conversion unit starts an accumulation of the signal charge in a state where the first transfer transistor and the second transfer transistor are in an off state, the second time is a timing in which the first transfer transistor is first turned on after the first time, and the signal charge is held only in the photoelectric conversion unit in the first period, and a second period which is a period from the second time to a third time, wherein the third time is a timing in which the first transfer transistor is first turned on after the first period, and the signal charge is held in the photoelectric conversion unit and the first holding unit in the second period, and the vertical scanning circuit is configured to turn on the fourth transfer transistor so that the second holding unit outputs the signal charge generated in the second frame period to the output unit in the first period of the first frame period.

2. The image pickup apparatus according to claim 1, wherein the first holding unit and the second holding unit output the signal charge held therein in a frame period subsequent to the frame period in which the signal charge transferred from the photoelectric conversion unit is held.

3. The image pickup apparatus according to claim 1, wherein the vertical scanning circuit controls the first transfer transistor and the second transfer transistor so that accumulation periods in each of which the signal charge is accumulated in the photoelectric conversion unit coincide with one another among the pixels.

4. The image pickup apparatus according to claim 3, wherein the vertical scanning circuit controls the first transfer transistor and the second transfer transistor so that the signal charge generated in the photoelectric conversion unit in one frame period is divided into parts to be sequentially transferred from the photoelectric conversion unit to the first holding unit or the second holding unit.

5. The image pickup apparatus according to claim 4, wherein:

each of the plurality of pixels further includes an overflow transistor that discharges the signal charge accumulated in the photoelectric conversion unit, and the vertical scanning circuit controls the overflow transistor to adjust a length of the accumulation periods.

6. The image pickup apparatus according to claim 5, wherein each of the accumulation periods is controlled as a period from when the overflow transistor is turned off to when the first transfer transistor or the second transfer transistor is turned on.

7. The image pickup apparatus according to claim 5, wherein each of the accumulation periods is controlled as a period from when the overflow transistor is turned off to when the overflow transistor is turned on.

8. The image pickup apparatus according to claim 5, wherein lengths of the accumulation periods are changed among frames.

9. The image pickup apparatus according to claim 8, wherein an HDR image is synthesized from a plurality of images obtained by changing the lengths of the accumulation periods among the frames.

10. The image pickup apparatus according to claim 3, wherein a holding period in which the first holding unit or the second holding unit holds the signal charge is longer than a corresponding one of the accumulation periods.

11. The image pickup apparatus according to claim 1, wherein the first frame period and the second frame period are alternately performed.

12. The image pickup apparatus according to claim 11, wherein:

the vertical scanning circuit is configured to transfer the signal charge generated in the second frame period to the second holding unit by plural times of transfer operations by turning on and off plural times the second transfer transistor in the second frame period, the second frame period includes a third period which is a period from a fourth time to a fifth time, wherein the fourth time is a timing in which the photoelectric conversion unit starts an accumulation of the signal charge in a state where the first transfer transistor and the second transfer transistor are in an off state, the fifth time is a timing in which the second transfer transistor is first turned on after the fourth time, and the signal charge is held only in the photoelectric conversion unit in the third period, and a fourth period which is a period from the fifth time to a sixth time, wherein the sixth time is a timing in which the second transistor is first turned on after the third period, and the signal charge is held in the photoelectric conversion unit and the second holding unit in the fourth period, and the vertical scanning circuit is configured to turn on the third transfer transistor so that the first holding unit outputs the signal charge generated in the first frame period to the output unit in the third period of the second frame period.

13. A method for controlling an image pickup apparatus, the image pickup apparatus including a plurality of pixels arranged in rows and columns, each of the plurality of pixels including:

a photoelectric conversion unit that accumulates a signal charge generated by photoelectric conversion of irradiated light, a first holding unit and a second holding unit that hold the signal charge which is transferred from the photoelectric conversion unit, an output unit that outputs, to a column signal line, a signal based on an amount of the signal charge held by the first holding unit or the second holding unit;

a first transfer transistor that transfers the signal charge from the photoelectric conversion unit to the first holding unit, a second transfer transistor that transfers the signal charge from the photoelectric conversion unit to the second holding unit,
a third transfer transistor that transfers the signal charge from the first holding unit to the output unit, and
a fourth transfer transistor that transfers the signal charge from the second holding unit to the output unit, and
a vertical scanning unit that controls the first transfer transistor, the second transfer transistor, the third transfer transistor, and the fourth transfer transistor,
wherein the photoelectric conversion unit has a storage capacity smaller than a holding capacity of each of the first holding unit and the second holding unit,
the method comprising:
holding, in the first holding unit, the signal charge generated in a first frame period, wherein the vertical scanning unit transfers the signal charge generated in the first frame period from the photoelectric conversion unit to the first holding unit by plural times of transfer operations by turning on and off plural times the first transfer transistor in the first frame period, and the first frame period includes:
 a first period which is a period from a first time to a second time, wherein the first time is a timing in which the photoelectric conversion unit starts an accumulation of the signal charge in a state where the first transfer transistor and the second transfer transistor are in an off state, the second time is a timing in which the first transfer transistor is first turned on after the first time, and the signal charge is held only in the photoelectric conversion unit in the first period, and
 a second period which is a period from the second time to a third time, wherein the third time is a timing in which the first transfer transistor is first turned on after the first period, and the signal charge is held in the photoelectric conversion unit and the first holding unit in the second period;
holding, in the second holding unit, the signal charge generated in a second frame period which is a period prior to the first frame period and not overlapping with the first frame period; and
the vertical scanning unit controlling to output the signal charge to the output unit from the second holding unit in the first period of the first frame period by turning on the fourth transfer transistor.

14. An image pickup system comprising:
the image pickup apparatus according to claim 1; and
a signal processing apparatus that processes a signal output from the image pickup apparatus.

* * * * *